(12) United States Patent
Sanji

(10) Patent No.: US 11,445,649 B2
(45) Date of Patent: Sep. 13, 2022

(54) COMPONENT MOUNTING SYSTEM

(71) Applicant: FUJI CORPORATION, Chiryu (JP)

(72) Inventor: Mitsuru Sanji, Toyota (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/258,286

(22) PCT Filed: Aug. 1, 2018

(86) PCT No.: PCT/JP2018/028861
§ 371 (c)(1),
(2) Date: Jan. 6, 2021

(87) PCT Pub. No.: WO2020/026379
PCT Pub. Date: Feb. 6, 2020

(65) Prior Publication Data
US 2021/0144891 A1   May 13, 2021

(51) Int. Cl.
*B23P 19/04* (2006.01)
*H05K 13/04* (2006.01)
*H05K 13/02* (2006.01)
*H05K 13/08* (2006.01)

(52) U.S. Cl.
CPC ....... *H05K 13/021* (2013.01); *H05K 13/0417* (2013.01); *H05K 13/0452* (2013.01); *H05K 13/086* (2018.08)

(58) Field of Classification Search
CPC ............. H05K 13/021; H05K 13/0452; H05K 13/0417; H05K 13/086
See application file for complete search history.

(56) References Cited

U.S. PATENT DOCUMENTS 9,489,730 B2 * 11/2016 Doettling .............. G06T 7/0004
9,545,045 B2 *  1/2017 Yamauchi .......... H05K 13/0061

FOREIGN PATENT DOCUMENTS

WO   WO 2017/033268 A1   3/2017

OTHER PUBLICATIONS

International Search Report dated Oct. 23, 2018 in PCT/JP2018/028861 filed on Aug. 1, 2018, 2 pages.

* cited by examiner

*Primary Examiner* — Paul D Kim
(74) *Attorney, Agent, or Firm* — Oblon, McClelland, Maier & Neustadt, L.L.P.

(57) ABSTRACT

A component mounting system that includes a unit exchange device configured to automatically exchange the component supply unit and a processing section configured to determine whether the attachment and detachment of the component supply unit is performed according to the attachment and detachment instruction based on the attachment and detachment record acquired by an acquisition section and the instruction list, and when it is determined that the attachment and detachment is performed according to the attachment and detachment instruction, to perform an update process to update the instruction list by deleting the corresponding attachment and detachment instruction.

4 Claims, 9 Drawing Sheets

Fig. 8

| INSTRUCTION NUMBER | ATTACHMENT AND DETACHMENT INSTRUCTION | | | | | |
|---|---|---|---|---|---|---|
| | FEEDER ID | TYPE OF COMPONENT | TARGET | SLOT NUMBER | TYPE OF ATTACHMENT AND DETACHMENT | |
| 1 | **A1 | a | IN-LINE STORAGE | 2 | DETACHMENT | |
| 2 | **B5 | b | IN-LINE STORAGE | 5 | DETACHMENT | |
| 3 | **G1 | g | IN-LINE STORAGE | 13 | DETACHMENT | |
| 4 | **I3 | i | IN-LINE STORAGE | 19 | DETACHMENT | |
| 5 | **A1 | a | MOUNTER(1) | 4 | ATTACHMENT | |
| 6 | **B5 | b | MOUNTER(1) | 5 | ATTACHMENT | |
| 7 | **D3 | d | MOUNTER(1) | 7 | ATTACHMENT | |
| 8 | **H4 | h | MOUNTER(1) | 9 | ATTACHMENT | |
| 9 | **G1 | g | MOUNTER(2) | 1 | ATTACHMENT | |
| 10 | **I3 | i | MOUNTER(2) | 2 | ATTACHMENT | |
| 11 | **D3 | d | IN-LINE STORAGE | 2 | ATTACHMENT | |
| 12 | **H4 | h | IN-LINE STORAGE | 5 | ATTACHMENT | |
| ⋮ | ⋮ | ⋮ | ⋮ | ⋮ | ⋮ | |

| FEEDER ID | TYPE OF COMPONENT | SLOT NUMBER | TYPE OF ATTACHMENT AND DETACHMENT | | TARGET | SLOT NUMBER | TYPE OF ATTACHMENT AND DETACHMENT |
|---|---|---|---|---|---|---|---|
| **A1 | a | 4 | ATTACHMENT | ⇐ | IN-LINE STORAGE | 2 | DETACHMENT |
| **B5 | b | 5 | ATTACHMENT | ⇐ | IN-LINE STORAGE | 5 | DETACHMENT |
| **D3 | d | 7 | DETACHMENT | ⇒ | IN-LINE STORAGE | 2 | ATTACHMENT |
| **H4 | h | 9 | DETACHMENT | ⇒ | IN-LINE STORAGE | 5 | ATTACHMENT |
| ⋮ | ⋮ | ⋮ | ⋮ | | ⋮ | ⋮ | ⋮ |

Fig. 12

| INSTRUCTION NUMBER | ATTACHMENT AND DETACHMENT INSTRUCTION | | | | | |
|---|---|---|---|---|---|---|
| | FEEDER ID | TYPE OF COMPONENT | TARGET | SLOT NUMBER | TYPE OF ATTACHMENT AND DETACHMENT | |
| ⋮ | ⋮ | ⋮ | ⋮ | ⋮ | ⋮ | |
| *2 | **F2 | f | IN-LINE STORAGE | 2 | DETACHMENT | ← ADDITIONAL REGISTRATION |
| *3 | **F2 | f | MOUNTER(1) | 6 | ATTACHMENT | ← ADDITIONAL REGISTRATION |
| 7 | **D3 | d | MOUNTER(1) | 7 | DETACHMENT | |
| ⋮ | ⋮ | ⋮ | ⋮ | ⋮ | ⋮ | |

COMPONENT MOUNTING SYSTEM

TECHNICAL FIELD

The present specification discloses a component mounting system.

BACKGROUND ART

Conventionally, in a component mounting system including a component mounter on which a cassette-type component supply unit (feeder) for supplying components is detachably mounted, a system including an exchange device for automatically exchanging the component supply unit has been proposed (for example, refer to Patent Literature 1). In this system, an exchange timing of each component supply unit is set based on a production plan of boards and a remaining amount of components in each component supply unit, and the exchange device is controlled so that the component supply unit can be attached and detached to be automatically exchanged at that exchange timing.

PATENT LITERATURE

PTL 1: WO2017/33268A1

BRIEF SUMMARY

Technical Problem

Incidentally, in the component mounting system described above, not only the exchange device but also an operator may attach and detach the component supply unit to the component mounter. For example, when it takes a long time to exchange the component supply unit by only the exchange device alone, in some cases, the operator may cooperate to exchange the component supply unit. In such a case, if information on the component supply unit attached or detached by the operator is not transferred to the exchange device, or the information on the component supply unit attached or detached by the exchange device is not transferred to the operator, it becomes difficult to appropriately exchange the component supply unit.

The main object of the present disclosure is to appropriately perform a cooperative operation between the exchange by the operator and the exchange by the unit exchange device in a case of automatically exchanging the component supply unit.

Solution to Problem

The present disclosure has taken following means to achieve the main object described above.

A component mounting system that includes a component mounter in which multiple component supply units that supply components are detachably arranged, the system including: a unit exchange device configured to automatically exchange the component supply unit between the unit exchange device and the component mounter; an instruction output section configured to output an exchange instruction of the component supply units, including an automatic exchange instruction to the unit exchange device, so as to be recognizable by an operator, based on an instruction list in which multiple attachment and detachment instructions are registered, in which a type of attachment and detachment, indicating the attachment or the detachment, are associated with identification information identifying the component supply unit targeted to be attached and detached, and positional information for the attachment and detachment in the component mounter; an acquisition section configured to acquire an attachment and detachment record that includes the identification information on the component supply unit, the positional information on the attachment and detachment, and the type of attachment and detachment when the component supply unit is attached and detached on the component mounter; and a processing section configured to determine whether the attachment and detachment of the component supply unit is performed according to the attachment and detachment instruction based on the attachment and detachment record acquired by the acquisition section and the instruction list, and when it is determined that the attachment and detachment is performed according to the attachment and detachment instruction, perform an update process to update the instruction list by deleting the corresponding attachment and detachment instruction.

The component mounting system in the present disclosure outputs the exchange instruction of the component supply units including the automatic exchange instruction to the unit exchange device so as to be recognizable by the operator based on the instruction list in which multiple attachment and detachment instructions are registered. Therefore, the attachment and detachment of component supply unit can be performed not only by the unit exchange device but also by the operator. In addition, in the component mounter, if the attachment and detachment of the component supply unit is performed, whether the attachment and detachment of the component supply unit is performed according to the attachment and detachment instruction is determined based on the attachment and detachment record and the instruction list, and when it is determined that the attachment and detachment is performed according to the attachment and detachment instruction, the update process to update the instruction list is performed by deleting the corresponding attachment and detachment instruction. Therefore, it is possible to appropriately prevent the attachment and detachment of the component supply unit already performed by any one of the unit exchange device and the operator from being performed by the other. Therefore, in the system where the component supply unit can be automatically exchanged, it is possible to appropriately perform the cooperative operation between the exchange by the operator and the exchange by the unit exchange device.

BRIEF DESCRIPTION OF DRAWINGS

FIG. 8 is an explanatory diagram illustrating an example of attachment and detachment instructions registered in instruction list L.

FIG. 9 is an explanatory diagram illustrating an example of the attachment and detachment instruction displayed on display 27.

FIG. 12 is an explanatory diagram illustrating how the attachment and detachment instruction is additionally registered in instruction list L.

DESCRIPTION OF EMBODIMENTS

Next, an embodiment for the present disclosure will be described with reference to the drawings.

Figure 1:
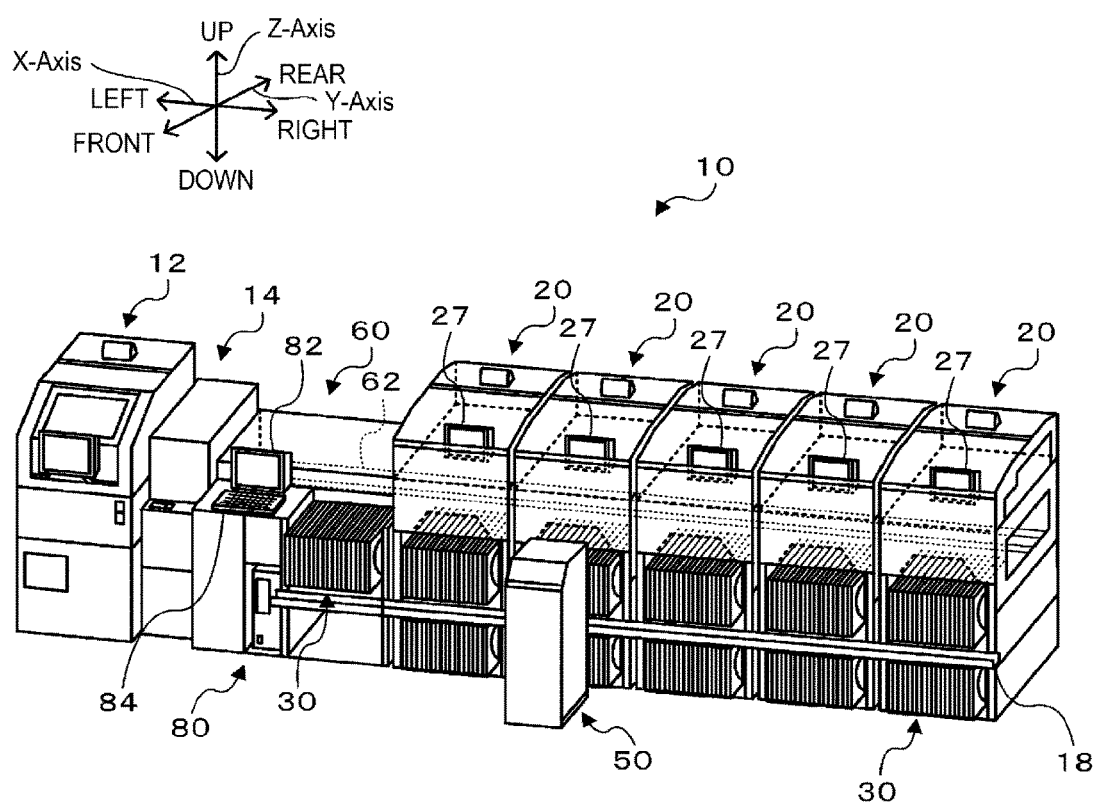
FIG. 1 is a configuration view illustrating an outline of a configuration of component mounting system 10.
Figure 2:
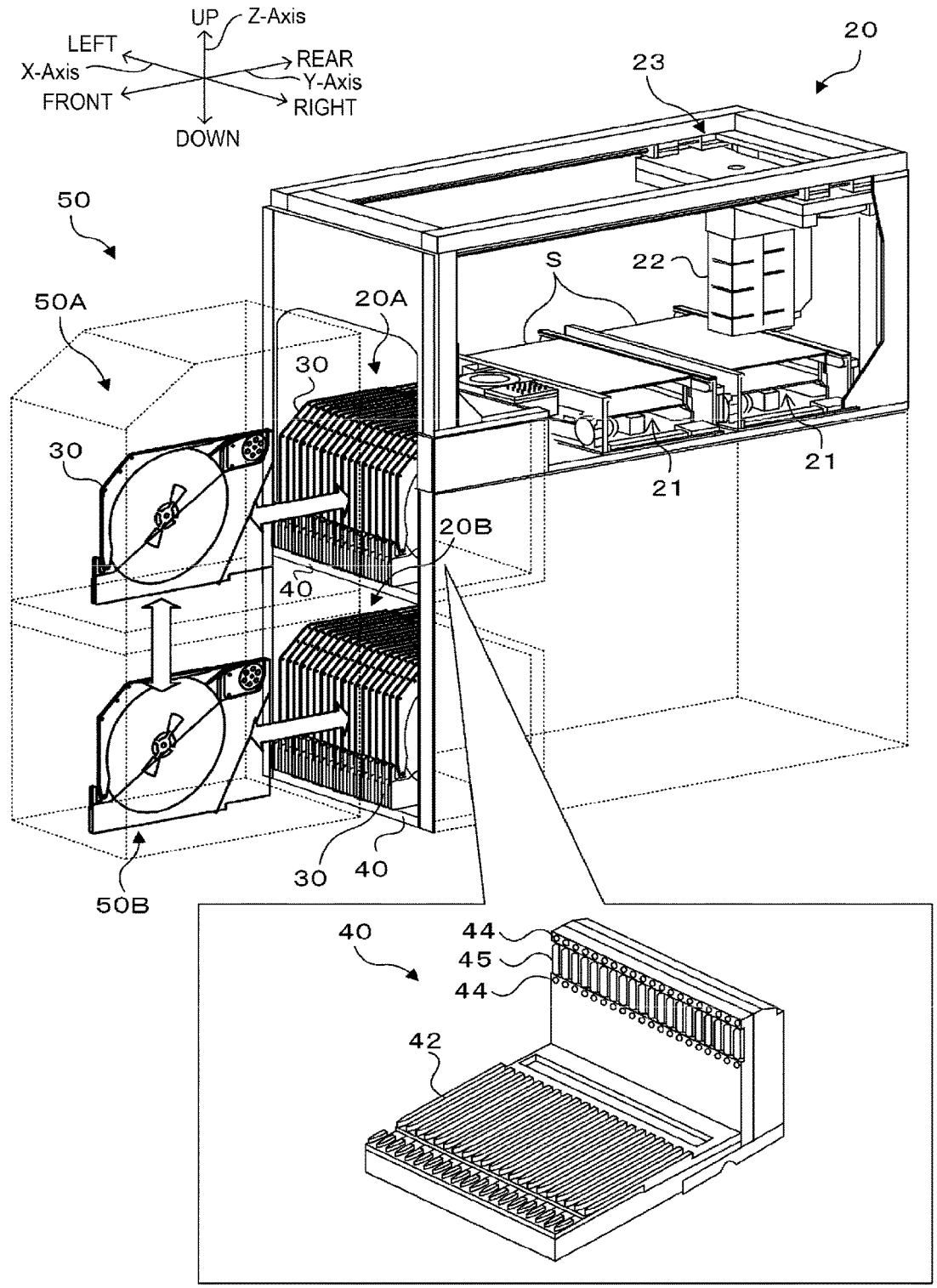
FIG. 2 is a configuration view illustrating an outline of a configuration of component mounter 20.
Figure 3:
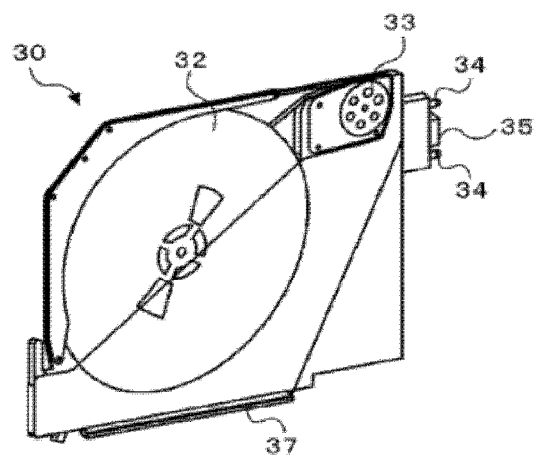
FIG. 3 is a configuration view illustrating an outline of a configuration of feeder 30.
Figure 4:
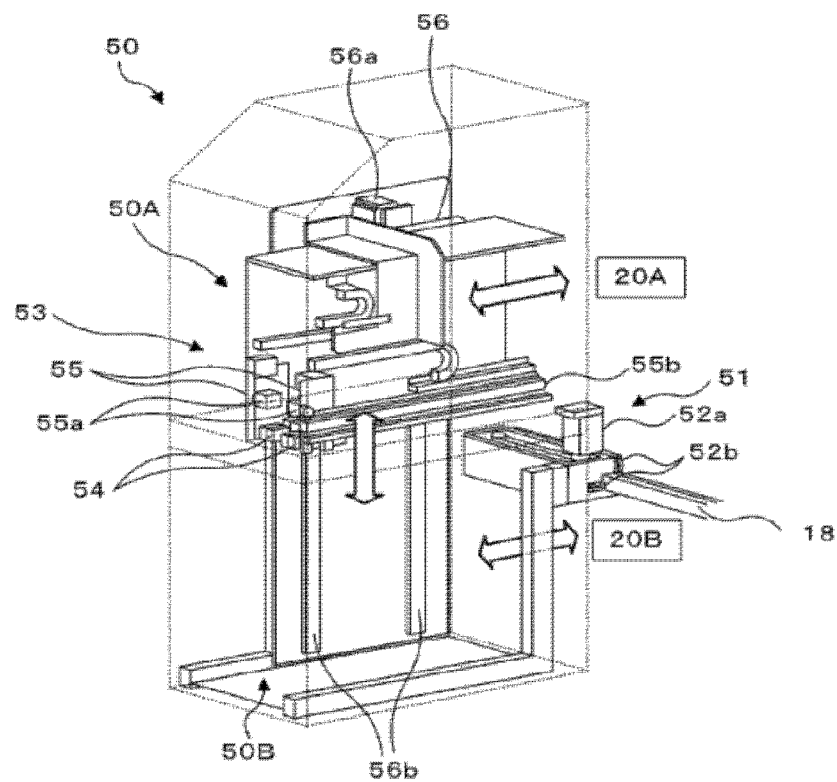
FIG. 4 is a configuration view illustrating an outline of a configuration of loader 50.
Figure 5:
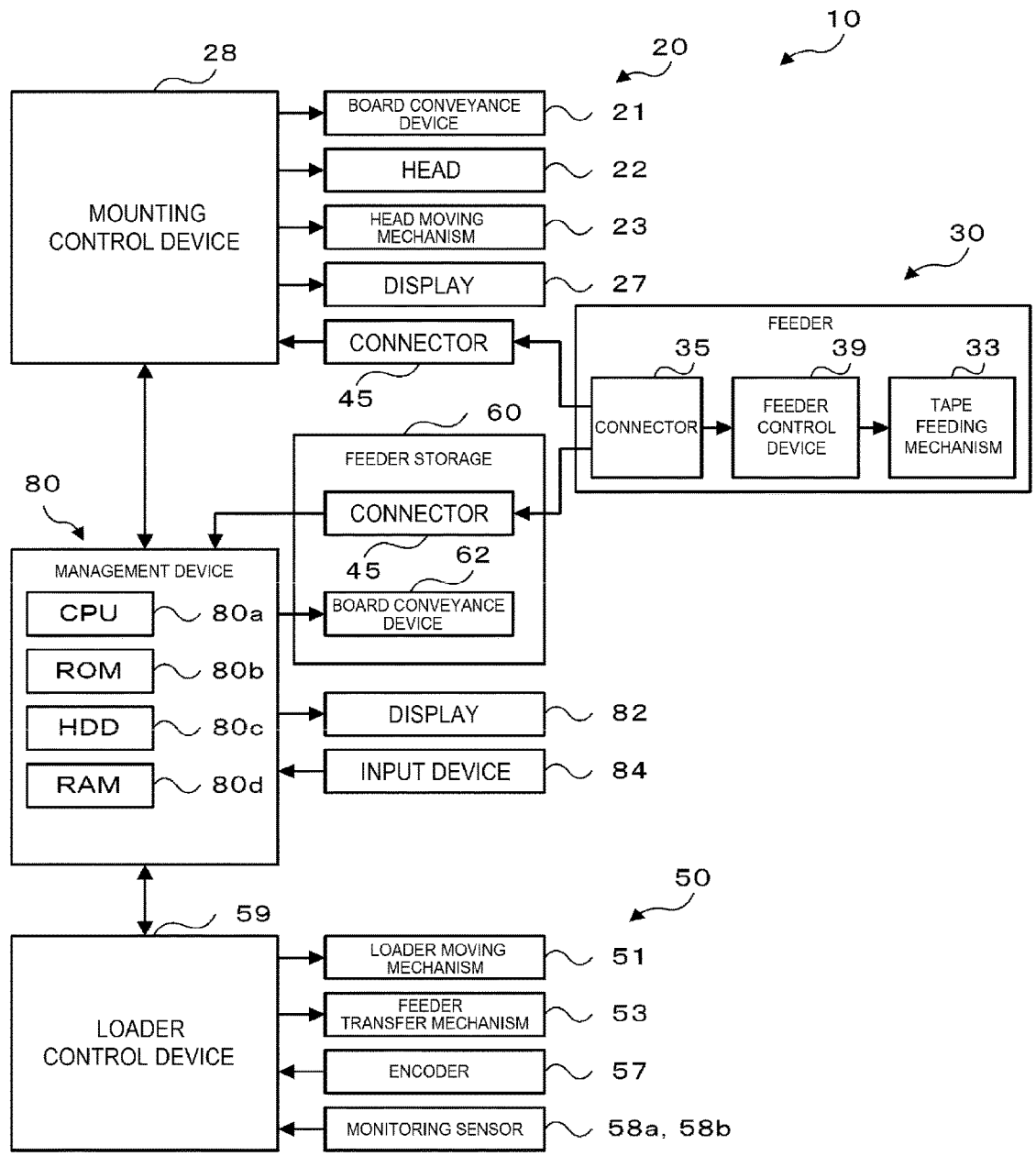
FIG. 5 is a configuration view relating to a control by component mounting system 10.

FIG. 1 is a configuration view illustrating an outline of a configuration of component mounting system 10 in the present embodiment, FIG. 2 is a configuration view illustrating an outline of a configuration of component mounter 20, and FIG. 3 is a configuration view illustrating an outline of a configuration of feeder 30. In addition, FIG. 4 is a configuration view illustrating an outline of a configuration of loader 50, and FIG. 5 is a configuration view relating to a control by component mounting system 10. The lateral direction in FIG. 1 is the X-direction, the longitudinal direction is the Y-direction, and the vertical direction is the Z direction.

As illustrated in FIG. 1, component mounting system 10 includes printer 12, printing inspector 14, multiple component mounters 20, a mounting inspector (not illustrated), loader 50, in-line storage 60, and management device 80. Printer 12 prints solder on board S. Printing inspector 14 inspects a state of the solder printed by printer 12. Multiple component mounters 20 are installed side by side along the conveyance direction (X-direction) of board S, and mount the components supplied from feeder 30 on board S. The mounting inspector inspects a mounting state of the components mounted by component mounter 20. Loader 50 can automatically exchange feeder 30 between multiple component mounters 20, and attaches a necessary feeder 30 or detaches used feeder 30. In-line storage 60 stores feeder 30 scheduled to be used by component mounters 20 and used feeders 30. Management device 80 manages the entire system. Printer 12, printing inspector 14, multiple component mounters 20, and the mounting inspector are arranged side by side in the conveyance direction of board S in this order and form a production line. In-line storage 60 is incorporated in the production line in component mounting system 10, and is installed between the most upstream component mounter 20 in the conveyance direction of board S among multiple component mounters 20 and printing inspector 14. In the present embodiment, the operator transports feeder 30 stored in a storage warehouse (not illustrated) and replenish to in-line storage 60, or the operator collects feeder 30 from in-line storage 60 and transports to the storage warehouse to store in the storage warehouse. In addition, the operator also attaches or detaches feeder 30 to component mounter 20 in order to support the automatic exchange by loader 50. In addition to these devices, component mounting system 10 may include a reflow device that performs a reflow process of board S on which the components are mounted.

As illustrated in FIG. 2, component mounter 20 includes board conveyance device 21 that conveys board S in the X-direction, head 22 that includes suction nozzle for picking up the components supplied by feeder 30, and head moving mechanism 23 that moves head 22 in the XY-direction, and display 27 such as an LCD (refer to FIG. 1). In addition, component mounter 20 includes mounting control device 28 (refer to FIG. 5) which is configured with well-known CPU, ROM, RAM, and the like, to control the entire device. Mounting control device 28 outputs a control signal to board conveyance device 21, head 22, head moving mechanism 23, display 27, and the like. In addition, component mounter 20 has two upper and lower areas to which feeder 30 can be attached in the front. The upper area is supply area 20A to which feeder 30 can supply the components, and the lower area is stock area 20B in which feeder 30 can be stocked. Supply area 20A and stock area 20B are provided with feeder base 40 having an L-shaped side view and to which multiple feeders 30 are attached. Component mounter 20 need not have stock area 20B.

As illustrated in FIG. 3, feeder 30 is configured as a tape feeder that sends out a tape that accommodates the components at a predetermined pitch. Feeder 30 includes tape reel 32 in which the tape is wound, tape feeding mechanism 33 that sends out the tape from tape reel 32, connector 35 having two positioning pins 34, rail member 37 provided at the lower end, and feeder control device 39 (refer to FIG. 5). As illustrated in FIG. 2, feeder base 40 includes multiple slots 42 that are arrayed in the X-direction at an interval in which rail member 37 of feeder 30 can be inserted, two positioning holes 44, and connector 45 provided between two positioning holes 44. When rail member 37 of feeder 30 is inserted into slot 42 of feeder base 40, two positioning pins 34 of feeder 30 are inserted into two positioning holes 44, connector 35 and connector 45 are connected to each other. Feeder control device 39 is configured with well-known CPU, ROM, RAM, and the like, and outputs a drive signal to tape feeding mechanism 33. In addition, feeder control device 39 can communicate with the control unit (mounting control device 28, management device 80, or the like.) to which feeder 30 is attached via the connections of connectors 35 and 45.

As illustrated in FIG. 1, loader 50 can move along X-axis rail 18 provided parallel to the conveyance direction (X-direction) of the board on the front of multiple component mounters 20 and the front of in-line storage 60. In FIG. 2, the illustration of X-axis rail 18 is omitted. As illustrated in FIGS. 4 and 5, loader 50 includes loader moving mechanism 51, feeder transfer mechanism 53, encoder 57, left and right monitoring sensors 58a and 58b, and loader control device 59.

Loader moving mechanism 51 moves loader 50 along X-axis rail 18, and includes X-axis motor 52a such as a servomotor that drives a driving belt and guide roller 52b that guides the movement of loader 50 along X-axis rail 18. Feeder transfer mechanism 53 transfers feeder 30 to component mounter 20 or to in-line storage 60. Feeder transfer mechanism 53 includes clamp section 54 that clamps feeder 30 and Y-axis slider 55 in which two clamp sections 54 are arranged, and two clamp sections 54 are integrally moved along Y-axis guide rail 55b in the longitudinal direction (Y-direction) by driving Y-axis motor 55a. Feeder transfer mechanism 53 includes two Y-axis sliders 55, and total four clamp sections 54 are moved in the Y-direction in pairs by arranging two clamp sections 54 in each of two Y-axis sliders 55. In addition, feeder transfer mechanism 53 includes Z-axis motor 56a that moves slide base 56 to which clamp section 54 and Y-axis slider 55 are slidably attached, in the vertical direction (Z direction) along Z-axis guide rail 56b.

Encoder 57 detects a movement position of loader 50 in the X-direction. Monitoring sensors 58a and 58b monitor the presence or absence of obstacles (including the operator), and are configured with, for example, infrared sensors. Monitoring sensor 58a is attached to the left side of loader 50 (opposite to the conveyance direction of board S), and mainly detects the obstacles in the monitoring area on the left side of loader 50. Monitoring sensor 58b is attached to the right side of loader 50 (on the same side as the conveyance direction of board S), and mainly detects the obstacles in the monitoring area on the right side of loader 50. Loader control device 59 is configured with a well-known CPU, ROM, RAM, and the like. Loader control device 59 inputs a detection signal from encoder 57 and monitoring sensors 58a and 58b, and outputs a drive signal to loader moving mechanism 51 (X-axis motor 52a) and feeder transfer mechanism 53 (clamp section 54, Y-axis motor 55a, and Z-axis motor 56a).

When performing the automatic exchange of feeder 30, first, loader control device 59 controls X-axis motor 52a to move loader 50 to slot 42 of component mounter 20 that performs the automatic exchange up to a position of facing Y-axis slider 55 of loader 50. In addition, when performing the automatic exchange between supply area 20A of component mounter 20, loader control device 59 controls Z-axis motor 56a to move slide base 56 (Y-axis slider 55) to upper transfer area 50A facing supply area 20A. On the other hand, when performing the automatic exchange between stock area 20B of component mounter 20, loader control device 59 controls Z-axis motor 56a to move slide base 56 to lower transfer area 50B facing stock area 20B. When attaching feeder 30 in loader 50 to component mounter 20, loader control device 59 controls Y-axis motor 55a in a state where feeder 30 is clamped in clamp section 54 to move Y-axis slider 55 to component mounter 20 side (rearward). In this way, rail member 37 of feeder 30 is inserted into slot 42 of feeder base 40. Subsequently, loader control device 59 attaches feeder 30 to feeder base 40 of component mounter 20 by releasing the clamp of feeder 30 by clamp section 54. In addition, when detaching feeder 30 from component mounter 20 and collecting feeder 30 in loader 50, loader control device 59 controls Y-axis motor 55a to move Y-axis slider 55 to component mounter 20 side (rearward). Subsequently, loader control device 59 clamps feeder 30 attached to feeder base 40 to clamp section 54, and then, controls Y-axis motor 55a to move Y-axis slider 55 forward. In this way, feeder 30 is removed from feeder base 40 and is collected in loader 50.

In order to accommodate multiple feeders 30, in-line storage 60 is provided with feeder base 40 having the same configuration as feeder base 40 provided in component mounter 20. Loader 50 can attach and detach feeder 30 to and from feeder base 40 in in-line storage 60 by the same operation as attaching and detaching feeder 30 to feeder base 40 of component mounter 20. In addition, behind in-line storage 60, board conveyance device 62 for conveying board S in the X-direction is provided. Board conveyance device 62 can convey board S received from the board conveyance device of printing inspector 14 and deliver board S to board conveyance device 21 of adjacent component mounter 20.

Figure 6:
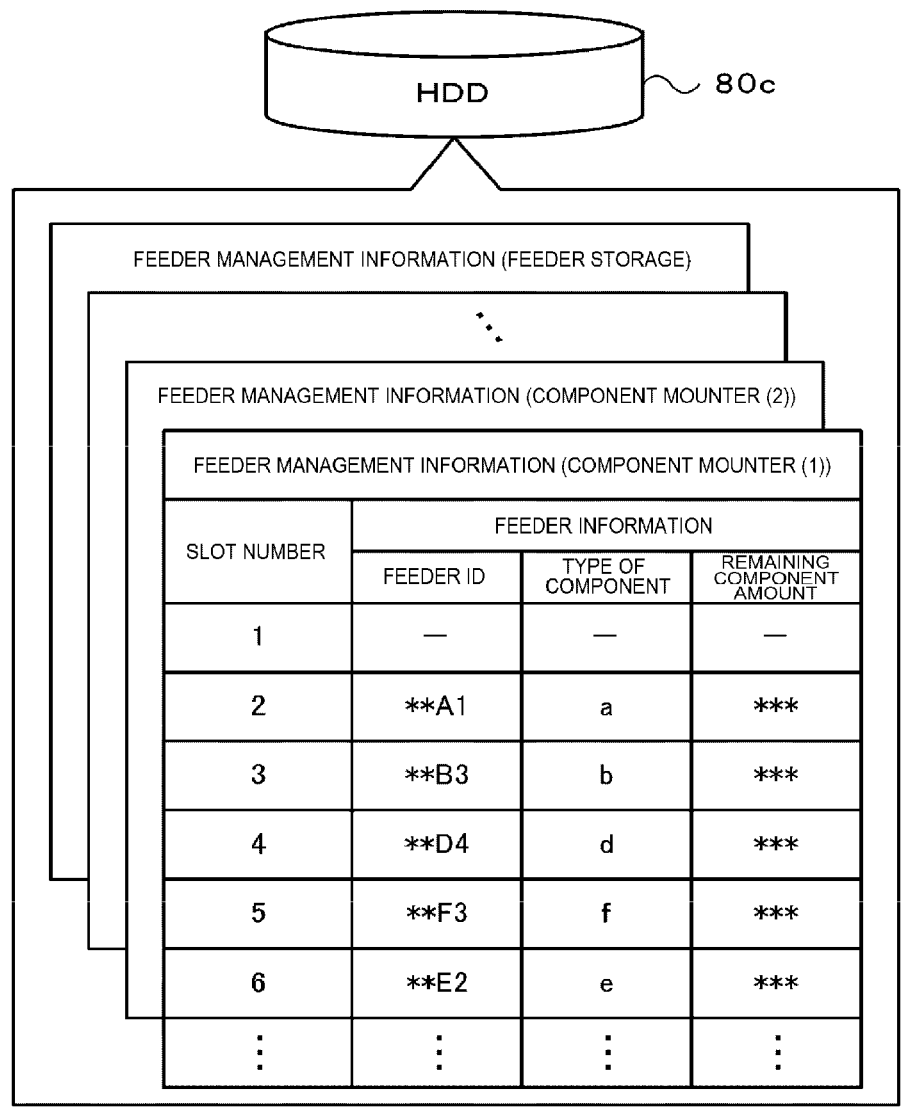
FIG. 6 is an explanatory diagram illustrating an example of feeder management information.

As illustrated in FIG. 5, management device 80 is configured with well-known CPU 80a, ROM 80b, HDD 80c, RAM 80d, and the like, and includes display 82 such as an LCD and input device 84 such as a keyboard and a mouse. Management device 80 stores jobs indicating production information of board S, feeder management information, and the like. In the jobs, which type of component will be mounted on board S in what order in each component mounter machine 20, and how many boards S mounted in this manner will be produced, are defined. In addition, in the job, arrangement information is defined, which indicates the arrangement of feeders 30 suitable for the mounting process when multiple feeders 30 corresponding to the types of component to be mounted in each component mounter 20 are mounted on feeder base 40 of supply area 20A. The feeder management information is information relating to feeder 30 held by each component mounter 20 and in-line storage 60. FIG. 6 is an explanatory diagram illustrating an example of the feeder management information. As illustrated in FIG. 6, the feeder management information includes a slot number of feeder base 40 to which each feeder 30 is mounted, a feeder ID (identification information) of feeder 30 attached to each slot 42, and the type of component possessed by each feeder 30, a remaining amount of the component, and the like. Each mounting control device 28 similarly manages its own feeder management information.

In addition, management device 80 is communicably connected to mounting control device 28 by wire and communicably connected to loader control device 59 wirelessly, and is also communicably connected to each control device such as printer 12, printing inspector 14, and mounting inspector. Management device 80 receives information relating to a mounting status of component mounter 20 and information relating to attached and detached feeder 30 (attachment and detachment record) from mounting control device 28, and receives information relating to a driving situation of loader 50 from loader control device 59. When the information relating to feeder 30 attached to feeder base 40 of component mounter 20 and feeder 30 removed from feeder base 40 is received from mounting control device 28, management device 80 updates the feeder management information of component mounter 20. In addition, if the attached and detached feeder 30 is based on instruction list L to attach and detach to and from component mounter 20, an update process for instruction list L is performed as described later. In addition, management device 80 outputs a drive signal to board conveyance device 62 of in-line storage 60 and causes board conveyance device 62 to convey board S. In addition, management device 80 is communicably connected to feeder control device 39 of feeder 30 attached to feeder base 40 of in-line storage 60 via connectors 35 and 45, and can acquire the information on feeder 30. When the information relating to feeder 30 attached to feeder base 40 of in-line storage 60 and feeder 30 removed from feeder base 40 is acquired, management device 80 updates the feeder management information in in-line storage 60.

Figure 7:
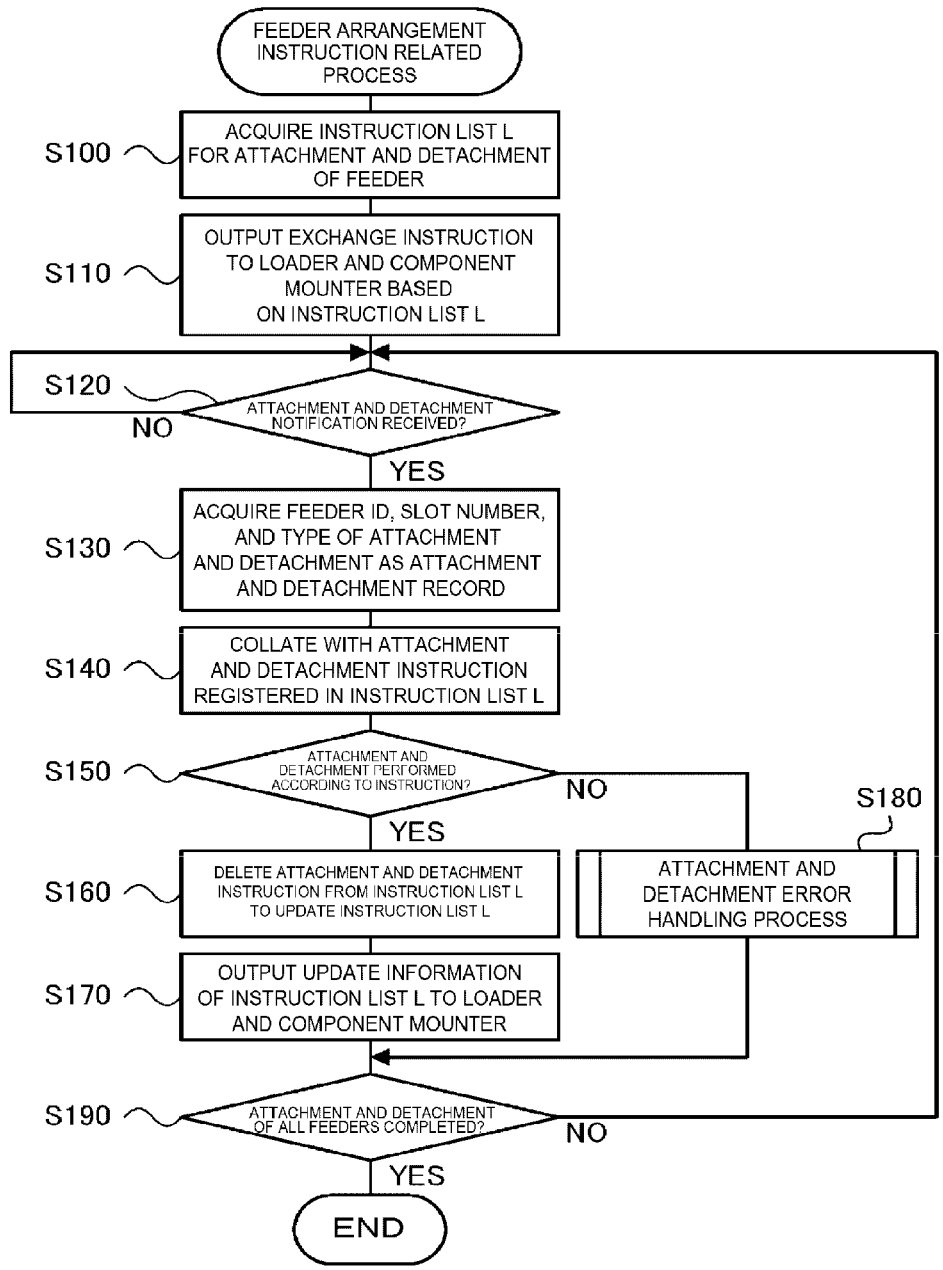
FIG. 7 is a flowchart illustrating an example of a feeder arrangement instruction related process.

The operation of component mounting system 10 configured in this manner, particularly the operation when instructing the arrangement of feeder 30 will be described. In the present embodiment, the instruction for arranging feeder 30 is not only output as an automatic exchange instruction to loader 50, but is also output such that the operator can recognize. FIG. 7 is a flowchart illustrating an example of the feeder arrangement instruction related process. This process is executed by CPU 80a of management device 80. In the feeder arrangement instruction related process, first, CPU 80a first acquires instruction list L for the attachment and detachment of feeder 30 (S100), and outputs the exchange instruction of feeder 30 to loader 50 and component mounter 20 based on instruction list L (S110).

FIG. 8 is an explanatory diagram illustrating an example of attachment and detachment instructions registered in instruction list L. In the attachment and detachment instructions registered in instruction list L, a feeder ID of feeder 30 to be attached and detached, a component type, and whether the target to be attached and detached is in-line storage 60 or multiple component mounters 20, a slot number (attachment and detachment position) in that target, and a type of attachment and detachment indicating whether it is attached or detached, are associated with each other. The component type may be omitted. Multiple component mounters 20 are, for example, component mounters 20 (1), (2), . . . in an order from the upstream. In addition, instruction list L is basically a list for causing loader 50 to perform the automatic exchange of feeder 30, and the instruction number indicates the order of automatic exchange by loader 50. Therefore, loader control device 59 performs the automatic exchange of feeder 30 by controlling loader 50 so that the attachment and detachment of feeder 30 are performed according to an order of the instruction number of each attachment and detachment instruction in instruction list L. However, the operator may perform the exchange of feeder 30, and in that case, the operator does not need to perform according to the instruction number, and can selectively exchange any of the feeders. In FIG. 8, for example, the instruction numbers 1 to 4 indicate the instruction to remove feeder 30 corresponding to its feeder ID from the slot numbers 2, 5, 13, and 19 in in-line storage 60. In addition, for feeder 30 removed by the instruction numbers 1 and 2, the instruction numbers 5 and 6 indicate the instruction to attach component mounter 20 (1) to slot numbers 4 and 5, and for feeder 30 removed by the instruction numbers 3 and 4, the instruction numbers 9 and 10 indicate the instruction to attach component mounter 20 (2) to slot numbers 1 and 2. As described above, in instruction list L, multiple attachment and detachment instructions of feeder 30 performed by in-line storage 60 and multiple component mounters 20 are registered. In FIG. 8, for convenience of explanation, the movement destination of each feeder 30 is indicated by an arrow, but instruction list L need not have the arrow indicating the movement destination as long as the attachment and detachment instruction is provided. Instruction list L may be created by management device 80, may be created by a higher-level management device that collectively manages multiple production lines, or may be registered in HDD 80c.

In addition, FIG. 9 is an explanatory diagram illustrating an example of the attachment and detachment instruction displayed on display 27. This is an example in which mounting control device 28 of each component mounter 20 displays the attachment and detachment instruction regarding its own device on display 27 based on the attachment and detachment instruction output to component mounter 20 in S110. FIG. 9 illustrates what is displayed on display 27 by mounting control device 28 of component mounter 20 (1). Therefore, among the instructions in instruction list L in FIG. 8, the instructions (instruction numbers 5 and 6 in FIG. 8) to attach feeder 30 detached from in-line storage 60 (instruction numbers 1 and 2 in FIG. 8) to the slot numbers 4 and 5 of component mounter 20 (1) which is its own device, are displayed. In addition, the instructions (instruction numbers 11 and 12 in FIG. 8) to attach feeder 30 detached from the slot numbers 7 and 9 of component mounter 20 (1) which is its own device (instruction numbers 7 and 8 in FIG. 8) to in-line storage 60 are displayed. Although not illustrated, the attachment and detachment instructions are similarly displayed on display 27 of other component mounters 20. Therefore, the operator can recognize the attachment and detachment instruction from display 27 of each component mounter 20 and can perform the exchange work of feeder 30. The management device 80 may cause the operator to recognize the attachment and detachment instruction by displaying instruction list L on display 82 in S110, or by printing instruction list L on a paper medium such as paper. In addition, if the operator has a mobile terminal and the like for work, the operator may be caused to recognize the attachment and detachment instruction by outputting instruction list L from management device 80 to the mobile terminal via wireless communication and displaying instruction list L on the screen of the mobile terminal.

When the exchange instruction is output in S110, CPU 80a waits for receiving an attachment and detachment notification indicating that the attachment and detachment of feeder 30 is performed from mounting control device 28 of each component mounter 20 (S120). When the attachment and detachment of feeder 30 to feeder base 40 is performed, mounting control device 28 transmits the attachment and detachment notification that includes an attachment and detachment record in which a feeder ID of attached and detached feeder 30, a slot number (attachment and detachment position), and a type of attachment and detachment for indicating whether it is the attachment or the detachment are associated with each other, to the management device 80. In the attachment and detachment record, the component type may be associated. Even when the attachment and detachment of feeder 30 is performed by any one of loader 50 or the operator, mounting control device 28 transmit the attachment and detachment notification to management device 80. When it is determined that the attachment and detachment notification is received in S120, CPU 80a acquires the feeder ID, the slot number, and the type of attachment and detachment as the attachment and detachment record included in the attachment and detachment notification, (S130).

Next, CPU 80a collates the acquired attachment and detachment record with the attachment and detachment instruction registered in instruction list L (S140), and determines whether the attachment and detachment of feeder 30 is performed according to the attachment and detachment instruction in instruction list L (S150). If the attachment and detachment instruction in which any of the feeder ID, the slot number, and the type of attachment and detachment match with those included in the attachment and detachment record is registered in instruction list L, CPU 80a determines that the attachment and detachment is performed according to the attachment and detachment instruction. When it is determined in S150 that the attachment and detachment is performed according to the attachment and detachment instruction, CPU 80a deletes the corresponding attachment and detachment instruction from instruction list L to update instruction list L (S160). Then, update information of instruction list L is output to loader 50 and component mounter 20 (S170). As the update information, because the attachment and detachment of feeder 30 based on the attachment and detachment instruction is already performed, information to delete the attachment and detachment instruction is output. Loader control device 59 that received the update information deletes the attachment and detachment instruction from the already received attachment and detachment instruction. Therefore, it is possible to prevent loader 50 from performing the automatic exchange of feeder 30 based on the attachment and detachment instruction in duplicate. In addition, in S170, CPU 80a may output update information to component mounter 20 targeted by the deleted attachment and detachment instruction. Mounting control device 28 of component mounter 20 that received the update information performs a process of deleting the attachment and detachment instruction from the display on display 27. Therefore, it is possible to prevent the operator from performing the exchange of feeder 30 based on the attachment and detachment instruction in duplicate. Therefore, it is possible to appropriately prevent the exchange of feeder 30 already performed by any one of loader 50 and the operator from being performed by the other.

On the other hand, when it is determined in S150 that the attachment and detachment is not performed according to the attachment and detachment instruction, CPU 80*a* determines that the operator performed the attachment and detachment work that is different from the attachment and detachment instruction, and then, executes an attachment and detachment error handling process (S180). When the processes of S170 or S180 is executed, CPU 80*a* determines whether the attachment and detachment of all feeders 30 are completed (S190), if it is determined not to be completed, performs a return process to S120, and if it is determined to be completed, ends the feeder arrangement instruction related process. Hereinafter, the attachment and detachment error handling process in S180 will be described.

Figures 10, 11:
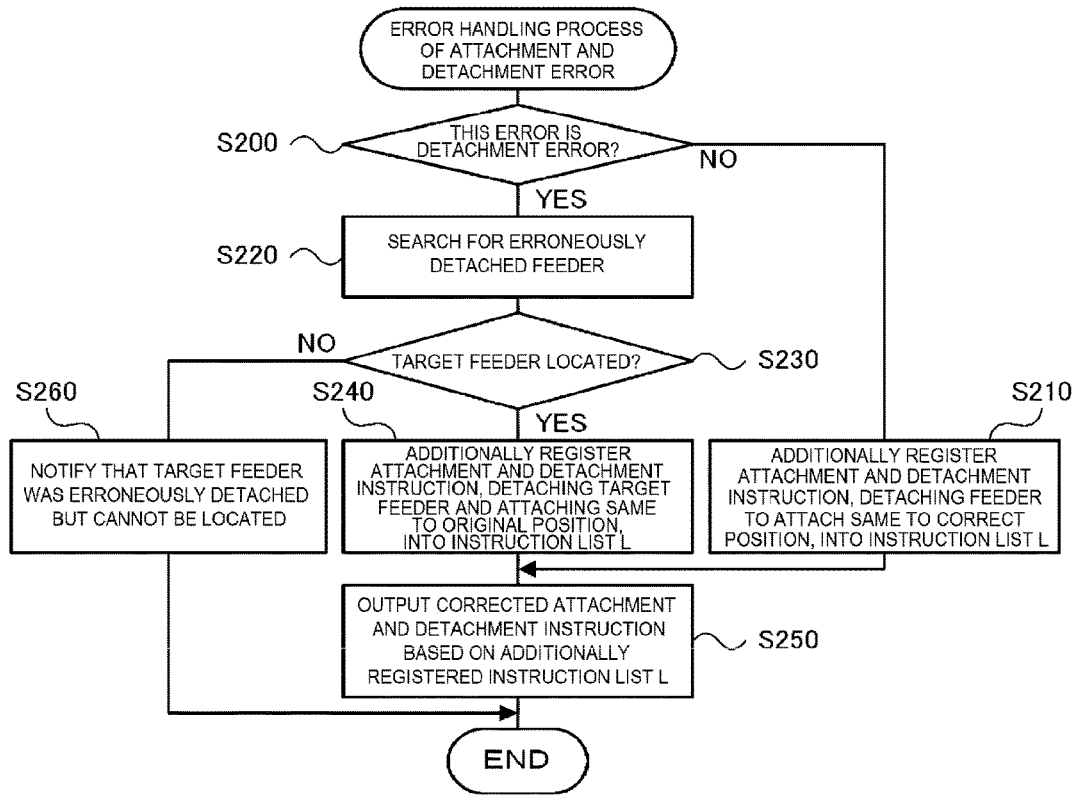
FIG. 10 is a flowchart illustrating an example of an attachment and detachment error handling process.
FIG. 11 is an explanatory diagram illustrating how the attachment and detachment instruction is additionally registered in instruction list L.

FIG. 10 is a flowchart illustrating an example of the attachment and detachment error handling process. In the attachment and detachment error handling process, CPU 80*a* determines whether the current attachment and detachment error is a detachment error for feeder 30 (S200). CPU 80*a* determines that it is a detachment error or the like when feeder 30 which is not in the attachment and detachment instruction is detached, and determines that it is an attachment error or the like when feeder 30 which is not in the attachment and detachment instruction is attached, or when feeder 30 is attached to slot 42 that is different from the slot number designated in the attachment and detachment instruction. When it determined in S200 that it is the attachment error rather than the detachment error, CPU 80*a* additionally registers the attachment and detachment instruction into instruction list L, instruction of which detaching feeder 30 corresponding to the attachment error and attaching the same to the correct position (S210). Then, CPU 80*a* outputs a correction attachment and detachment instruction for correcting the current attachment error based on the additionally registered instruction list L (S250), and ends the attachment and detachment error handling process. CPU 80*a* output the attachment and detachment instruction in S250 to loader 50 and component mounter 20. Therefore, the attachment error by the operator can be corrected by loader 50. In addition, by mounting control device 28 of component mounter 20 displaying the correction attachment and detachment instruction on display 27, the operator can also correct the error based on the attachment and detachment instruction.

Here, FIG. 11 is an explanatory diagram illustrating how the attachment and detachment instruction is additionally registered in instruction list L. FIG. 11 illustrates an example in which the attachment and detachment instruction for correcting the attachment error is additionally registered. In this example, a case is assumed, in which feeder 30 with the feeder ID "B5" has to be attached to the slot number 5 of component mounter 20 (1) (instruction number 6), but the operator erroneously attaches the feeder to the slot number 6. In this case, CPU 80*a* additionally registers an attachment and detachment instruction (\*1) so as to detach the feeder 30 from the slot number 6 and attach the feeder to the slot number 5. In FIG. 11, the instruction number of the attachment and detachment instruction additionally registered is set to be \*1 for the convenience of explanation, but CPU 80*a* may reassign the instruction number including the additionally registered attachment and detachment instruction. In addition, FIG. 11 illustrates a state in which the attachment and detachment instruction to detach the feeder from the slot number 6 is additionally registered while leaving the attachment and detachment instruction in the instruction number 6, but CPU 80*a* may delete the attachment and detachment instruction (instruction number 6) to attach the feeder to the slot number 5 at the time when the attachment error is detected, and then, may additionally register the attachment and detachment instruction to attach the feeder to the slot number 5. When feeder 30 is attached and detached based on the additionally registered attachment and detachment instruction, CPU 80*a* determines that the instruction is performed according to instruction in S150 described above, and performs the process.

In addition, when it is determined in S200 that the current attachment and detachment error is a detachment error, CPU 80*a* searches for feeder 30 erroneously detached by the operator (S220), and determines whether the target feeder 30 can be located (S230). In this case, since feeder 30 that is erroneously detached may be attached to in-line storage 60 by the operator, CPU 80*a* searches the in-line storage 60. CPU 80*a* may perform the search in S220 for a predetermined time and then may perform the determination in S230 while taking the time for the operator to move to in-line storage 60 into consideration. If the erroneously detached feeder 30 is attached to another component mounter 20, CPU 80*a* determines that the attachment and detachment is not performed according to the instruction in S150 described above, and performs this attachment and detachment error handling process. In this case, CPU 80*a* can determine in S200 that it is the attachment error, and executes S210 and S250, and makes the correction as described above.

When it is determined that feeder 30, being erroneously detached, can be located, CPU 80*a* additionally registers the attachment and detachment instruction into instruction list L, instruction of which attaching the target feeder 30 to the original position by detaching the same from the located place (S240). Then, CPU 80*a* outputs the correction attachment and detachment instruction for correcting the current detachment error based on additionally registered instruction list L (S250), and ends the attachment and detachment error handling process. In this case also, the detachment error of the operator can be corrected by loader 50. In addition, it is also possible for the operator to make correction based on the correction attachment and detachment instruction displayed on display 27.

Here, FIG. 12 is an explanatory diagram illustrating how the attachment and detachment instruction is additionally registered in instruction list L. FIG. 12 illustrates an example in which the attachment and detachment instructions for correcting the detachment errors are additionally registered. In this example, a case is assumed, in which the operator erroneously detaches feeder 30 having the feeder ID "F2" and is attached to the slot number 6 of component mounter 20 (1) by an error as the instruction number 7, and attaches the feeder to the slot number 2 of in-line storage 60. In this case, CPU 80*a* determines that feeder 30 can be located from in-line storage 60, and additionally register the attachment and detachment instructions (\*2 and \*3) so as to detach feeder 30 from the slot number 2 of in-line storage 60 and to attach the feeder to the slot number 6 of component mounter 20(1) that is the original position. In this case also, CPU 80*a* may reassign the instruction number including the additionally registered attachment and detachment instruction. In addition, when feeder 30 is attached and detached based on the additionally registered attachment and detachment instruction, CPU 80*a* determines that the instruction is performed according to the instruction in S150 described above and performs the process.

In addition, as a result of the search in S220, if it is determined in S230 that erroneously detached feeder 30 cannot be located, CPU 80*a* notifies a fact that target feeder 30 is erroneously detached and cannot be located (S260), and ends the attachment and detachment error handling process. In this case, CPU 80*a* determines that feeder 30 of the detachment error is transported to another location different from in-line storage 60, for example, the storage warehouse, and performs the process in S260. In addition, CPU 80*a* can send the notification in S260 to component mounter 20 from which feeder 30 is erroneously detached. If mounting control device 28 of component mounter 20 that has received the notification displays the notification content on display 27, it becomes possible for the operator to take an action. Further, the notification in S260 may be performed by outputting a voice from a speaker (not illustrated), turning on or blinking a warning lamp, or the like. Since it is desirable that such notification is performed as soon as possible after the operator erroneously detach feeder 30, the notification in S260 may be performed while searching in S220 is performed. In addition, if multiple production lines are arranged adjacently, CPU 80*a* may perform the notification in S260 to management device 80 that manages another production line or a higher-level management device that centrally manages multiple production lines.

Here, the correspondence relationship between the configuration elements in the present embodiment and the configuration elements in the present disclosure will be clarified. Feeder 30 in the present embodiment corresponds to a component supply unit, component mounter 20 corresponds to a component mounter, and loader 50 corresponds to a unit exchange device, management device 80 that executes the feeder arrangement instruction related process in S110 in FIG. 7 corresponds to an instruction output section, management device 80 that executes the feeder arrangement instruction related process in S130 corresponds to an acquisition section, and management device 80 that executes the feeder arrangement instruction related process in S140 to S180 corresponds to a processing section.

Since the exchange instruction of feeder 30 is output based on instruction list L so as to be recognizable by the operator, component mounting system 10 described above can cause not only loader 50 but also the operator to exchange feeder 30. In addition, if feeder 30 is attached and detached, component mounting system 10 determines whether the attachment and detachment are performed according to the attachment and detachment instruction in instruction list L, and if the attachment and detachment are performed according to the attachment and detachment instruction, deletes the corresponding attachment and detachment instruction and updates the instruction list L. Therefore, since it is possible to prevent the attachment and detachment of feeder 30 already performed by any one of loader 50 and the operator from being performed by the other in duplicate, and thus, the cooperative operation by loader 50 and the operator can be appropriately performed.

In addition, in component mounting system 10, since the attachment and detachment error handling process is performed when the attachment and detachment of feeder 30 is not performed according to the attachment and detachment instruction, it is possible for the operator to appropriately handle the attachment and detachment error.

In addition, in component mounting system 10, if the attachment of feeder 30 is not performed according to the attachment and detachment instruction, an attachment and detachment instruction for detaching feeder 30 and attaching the feeder to an appropriate position is additionally registered in instruction list L, and a new exchange instruction is output. Therefore, when the attachment of feeder 30 is not performed according to the instruction, the feeder can be appropriately reattached by loader 50.

In addition, in component mounting system 10, if the detachment of feeder 30 is not performed according to the attachment and detachment instruction, that feeder 30 is searched, and if feeder 30 is located, the attachment and detachment instruction for detaching feeder 30 and for attaching the feeder to the original position is additionally registered in instruction list L, and then, a new exchange instruction is output. Therefore, even when the detachment of feeder 30 is not performed according to the instruction, the feeder can be appropriately reattached by loader 50. In addition, if feeder 30 is not located, since that effect is notified, it is possible for the operator or the like to make a correction handling.

It goes without saying that the present disclosure is not limited to the embodiment described above, and can be implemented in various aspects as long as it belongs to the technical scope of the present disclosure.

For example, in the embodiment described above, when the attachment of feeder 30 is not performed according to the attachment and detachment instruction, the attachment and detachment instruction for detaching feeder 30 and attaching the feeder to the appropriate position is additionally registered in instruction list L, but the present disclosure is not limited to this. For example, when the attachment of feeder 30 is not performed according to the attachment and detachment instruction, the attachment error may be immediately notified to the operator. For example, this notification of error can be displayed on display 27 of component mounter 20.

In the embodiment described above, if the detachment of feeder 30 is not performed according to the attachment and detachment instruction, a different handling is performed depending on whether feeder 30 is located, but the present disclosure is not limited to this. For example, if the detachment of feeder 30 is not performed according to the attachment and detachment instruction, a process of notifying the operator of the detachment error may be uniformly performed.

In the embodiment described above, in any case where the attachment of feeder 30 is not performed according to the attachment and detachment instruction and where the detachment of feeder 30 is not performed according the attachment and detachment instruction, a new attachment and detachment instruction is recognizably output to the operator, but the present disclosure is not limited to this. For example, the new attachment and detachment instruction may be output only to loader 50 without making it recognizable by the operator.

In the embodiment described above, the deletion or the additional registration of the attachment and detachment instruction to or from the instruction list L is performed by management device 80, but the present disclosure is not limited to this. For example, loader control device 59 that received the necessary information from management device 80 may perform the deletion or additional registration of the attachment and detachment instruction to or from instruction list L.

In the embodiment described above, component mounter 20 includes stock area 20B, but this may not be included. In this case, loader 50 may not include lower transfer area 50B, or lower transfer area 50B may be used as the stock area of feeder 30 in loader 50.

In the component mounting system in the present disclosure, when it is determined that the attachment and detachment of the component supply unit is performed according to the attachment and detachment instruction, the processing section may perform the handling process such that the component supply unit is reattached and detached. In this way, since it becomes possible to handle the case where the attachment and detachment of the component supply unit is erroneously performed by the operator instead of being performed according to the attachment and detachment instruction, the cooperative operation can be performed more appropriately.

In the component mounting system in the present disclosure, when it is determined that the attachment of the component supply unit is not performed according to the attachment and detachment instruction, as the handling process, the processing section may perform an update process of the instruction list by additionally registering the attachment and detachment instruction for detaching the component supply unit and attaching to an appropriate position, and when the instruction list is updated by the additional registration of the attachment and detachment instruction, the instruction output section may output a new exchange instruction. In this way, even if the attachment of the component supply unit is not performed according to the instruction, the unit exchange device can appropriately perform the reattachment.

In the component mounting system in the present disclosure, when it is determined that the detachment of the component supply unit is not performed according to the attachment and detachment instruction, as the handling process, the processing section may search for the detached component supply unit, and if the component supply unit is located, perform the update process of the instruction list by additionally registering the attachment and detachment instruction for attaching the component supply unit to the original position, and if the component supply unit is not located, may perform the notification process to notify that fact, and when the update process of the instruction list is performed with the additional registration of the attachment and detachment instruction, the instruction output section may output a new exchange instruction. In this way, even if the detachment of the component supply unit is not performed according to the instruction, if the component supply unit is located, the component supply unit can be appropriately returned by the unit exchange device. In addition, if the component supply unit is not located, it is possible to handle the error by an operator by notifying this fact.

INDUSTRIAL APPLICABILITY

The present disclosure can be used in the manufacturing industry of component mounting systems and the like.

REFERENCE SIGNS LIST

10 component mounting system, 12 printer, 14 printing inspector, 18 X-axis rail, 20 component mounter, 20A supply area, 20B stock area, 21 board conveyance device, 22 head, 23 head moving mechanism, 27 display, 28 mounting control device, 30 feeder, 32 tape reel, 33 tape feeding mechanism, 34 positioning pin, 35 connector, 37 rail member, 39 feeder control device, 40 feeder base, 42 slot, 44 positioning hole, 45 connector, 50 loader, 50A upper transfer area, 50B lower transfer area, 51 loader moving mechanism, 52*a* X-axis motor, 52*b* guide roller, 53 feeder transfer mechanism, 54 clamp section, 55 Y-axis slider, 55*a* Y-axis motor, 55*b* Y-axis guide rail, 56 slide base, 56*a* Z-axis motor, 56*b* Z-axis guide rail, 57 encoder, 58*a*, 58*b* monitoring sensor, 59 loader control device, 60 in-line storage, 62 board conveyance device, 80 management device, 80*a* CPU, 80*b* ROM, 80*c* HDD, 80*d* RAM, 82 display, 84 input device, L instruction list, S board.

The invention claimed is:

1. A component mounting system that includes a component mounter in which multiple component supply units that supply components are detachably arranged, the system comprising:
    a loader configured to automatically exchange one component supply unit of the multiple component supply units between the loader and the component mounter;
    an instruction output section configured to output an exchange instruction of the component supply units, including an automatic exchange instruction to the loader, so as to be recognizable by an operator, based on an instruction list in which multiple attachment and detachment instructions are registered,
    in which a type of attachment and detachment, indicating the attachment or the detachment, are associated with identification information identifying the component supply unit targeted to be attached and detached, and positional information for the attachment and detachment in the component mounter;
    an acquisition section configured to acquire an attachment and detachment record that includes the identification information on the component supply unit, the positional information on the attachment and detachment, and the type of attachment and detachment when the component supply unit is attached and detached on the component mounter; and
    a processing section configured to determine whether the attachment and detachment of the component supply unit is performed according to the attachment and detachment instruction based on the attachment and detachment record acquired by the acquisition section and the instruction list, and when it is determined that the attachment and detachment is performed according to the attachment and detachment instruction, perform an update process to update the instruction list by deleting the corresponding attachment and detachment instruction.

2. The component mounting system according to claim 1, wherein the processing section is configured to perform an handling process such that the component supply unit is reattached and redetached when it is determined that the attachment and detachment of the component supply unit is not performed according to the attachment and detachment instruction.

3. The component mounting system according to claim 2, wherein the processing section is configured to perform an update process of the instruction list by additionally registering the attachment and detachment instruction for detaching the component supply unit and attaching the component supply unit to an appropriate position as the handling process when it is determined that the attachment of the component supply unit is not performed according to the attachment and detachment instruction, and
    the instruction output section is configured to output a new exchange instruction when the instruction list is updated by the additional registration of the attachment and detachment instruction.

4. The component mounting system according to claim 2, wherein the processing section is configured to search for the detached component supply unit as the handling process when it is determined that the detachment of the component supply unit is not performed according to the attachment and detachment instruction, and perform the update process of the instruction list by additionally registering the attachment and detachment instruction for detaching the component supply unit and attaching the component supply unit to an original position if the component supply unit is located, and perform a notification process to notify that fact if the component supply unit is not located, and the instruction output section is configured to output a new exchange instruction when the update process of the instruction list is performed with the additional registration of the attachment and detachment instruction.

* * * * *